(12) United States Patent
Ohtsuka

(10) Patent No.: US 6,225,839 B1
(45) Date of Patent: May 1, 2001

(54) BUFFER CIRCUIT

(75) Inventor: Shigeki Ohtsuka, Buzen (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/449,219

(22) Filed: Nov. 24, 1999

(30) Foreign Application Priority Data

Nov. 26, 1998 (JP) .................................................. 10-335961

(51) Int. Cl.$^7$ ................................................... H03K 3/00
(52) U.S. Cl. ......................... 327/108; 327/362; 327/484; 327/491
(58) Field of Search ............................ 327/108–112, 362, 327/478, 482, 484, 491

(56) References Cited

U.S. PATENT DOCUMENTS 5,896,058 * 4/1999 Sanzo et al. .......................... 327/111
5,900,774 * 5/1999 Park ..................................... 327/108

* cited by examiner

Primary Examiner—Kenneth B. Wells
(74) Attorney, Agent, or Firm—William B. Kempler; Frederick J. Telecky, Jr.

(57) ABSTRACT

To provide a buffer circuit that is able to achieve a reduction of the input current and a high input impedance by compensating the base current of a transistor, and to avoid a lowering of the input dynamic range by means of a current compensation circuit. By means of transistor P2, the base voltage of transistor Q2 is established in response to the signal of input node ND1 of the differential circuit, and the emitter voltage of transistor Q2 is set at virtually the same level as the reference voltage $V_{ref}$. The collector current $I_{C2}$ of transistor P2 is the same as the base current of transistor Q2, and is established with the amplification ratio of transistor Q2 as well as the current $I_2$ of current source IS2. The collector current $I_{C1}$ of transistor P1 is made equal to $I_{C2}$, and when the current amplification ratios of transistors Q1 and Q2 are made equal, the base current of transistor Q1 can be sufficiently compensated by means of the collector current $I_{C1}$ of transistor P1, and the input current $I_{IN}$ of the buffer circuit will be reduced.

12 Claims, 1 Drawing Sheet

BUFFER CIRCUIT

FIELD OF THE INVENTION

The present invention pertains to a buffer circuit having high input impedance.

BACKGROUND OF THE INVENTION

For a buffer circuit utilizing bipolar transistor, a leakage current deriving from the transistor base current is generated at the signal input terminal, such that the input impedance of the buffer circuit is lowered. In order to counter this, effect usually a current compensation current is provided to compensate the base current of the transistor.

FIG. 3 shows an example of a buffer circuit having a current compensation circuit. As shown in the figure, in addition to a transistor Q11 that constitutes an emitter follower, this buffer circuit is provided with a current compensation generation circuit comprising transistor Q12 and transistors Q13 and Q14. Transistors Q11 and Q12 are npn transistors, and transistors Q13 and Q14 are pnp transistors.

The base of transistor Q11 is connected to the input terminal of the buffer circuit. The emitter of transistor Q11 is connected to current source IS10, and is connected to the output terminal of the buffer circuit. The emitter of transistor Q12 is connected to the collector of transistor Q11, and the collector is connected to power source voltage $V_{CC}$. Transistors Q13 and Q14 constitute a current mirror circuit. The bases of transistors Q13 and Q14 are connected to each other, and that connection is connected to the collector of transistor Q14 as well as to the base of transistor Q12. The emitters of transistors Q13 and Q14 are connected to power source voltage $V_{CC}$, and the collector of transistor Q13 is connected to the base of transistor Q11, in other words, to the signal input terminal.

When an input signal $V_{IN}$ is input to the input terminal of the buffer circuit, a signal $V_{OUT}$ is output from the emitter of transistor Q11, in other words, from the output terminal of the buffer circuit, in response to the input signal $V_{IN}$. When the current value of current source IS10 is made equal to $I_1$, the emitter current of transistor Q11 becomes $I_1$. Furthermore, when the base current of transistor Q11 is made equal to $I_{B1}$, the emitter current $I_2$ of transistor Q12—in other words, of the collector of transistor Q11—is found using the following formula:

Formula 1

$$I_2 = I_1 - I_{B1} \quad (1)$$

Since the base current $I_{B1}$ is extremely small, virtually the same current flows in the emitter of transistor Q12 as in the emitter of transistor Q11. By means of the current mirror circuit formed by transistors Q13 and Q14, a current $I_3$ that is virtually the same as the base current $I_{B2}$ of transistor Q12 is output to the collector of transistor Q13. The current $I_3$ is input to the base of transistor Q11 as a compensation current. Consequently, The current $I_{IN}$ flowing into the input terminal becomes the difference current between the base current $I_{B1}$ of transistor Q11 and the current $I_3$ generated by the current mirror. It is calculated using the following formula:

Formula 2

$$I_{IN} = I_{B1} - I_3 \quad (2)$$

As can be seen from Formula 2, the base current of transistor Q11 is partially offset by means of the compensation current generated by the current compensation circuit, such that the input current of the input terminal is decreased and a high input impedance is attained for the buffer circuit.

However, with the aforementioned conventional buffer circuit, when the current amplification ratio of the pnp transistors Q13 and Q14 which form the current compensation circuit is small, the compensation current $I_3$ that is generated cannot completely compensate the base current $I_{B1}$ of transistor Q11. Furthermore, there is a disadvantage in that the input dynamic range of the buffer circuit is reduced by the voltage $V_{BEP}$ between the bases-emitters of the pnp transistors Q13 and Q14.

For example, when the current amplification ratio of the npn transistors Q11 and Q12 is made $\beta_N$ and the current amplification ratio of the pnp transistors Q13 and Q14 is made $\beta_P$, the base current $I_{B1}$ of transistor Q11 becomes $I_1/(1+\beta_N)$ and the emitter current $I_2$ of transistor Q12 becomes $\beta_N I_1/(1+\beta_N)$, the same as that of the collector current of transistor Q11. Therefore, the base current $I_{B2}$ of transistor Q12 is found with the following formula.

Formula 3

$$I_{B2} = I_2/(I+\beta_N) = \beta_N I_1/(1+\beta_N)^2 \quad (3)$$

Furthermore, for the aforementioned current mirror circuit, the following relationship is established for the collector current $I_3$ of transistor Q13 and the base current $I_{B2}$ of transistor Q12.

Formula 4

$$I_{B2} = I_3 + 2I_3/\beta_P = (2+\beta_P)I_3/\beta_P$$

From Formulas 3 and 4, the following formula can be found.

Formula 5

$$I_3 = \beta_N \beta_P I_1/(1+\beta_N)^2(2+\beta_P) \quad (5)$$

Consequently, the input current $I_{IN}$ of Formula 2 is found in the following manner.

Formula 6

$$I_{IN} = I_{B1} - I_3 = I_1/(1+\beta_N) - \beta_N \beta_P I_1/(1+\beta_N)^2(2+\beta_P) = [2(1+\beta_N)+\beta_P]I_1/(1+\beta_N)^2(2+\beta_P) \quad (6)$$

$\beta_N$ satisfies [the inequality] ($\beta_N \gg 1$); in addition, when $\beta_P$ is extremely small compared to $\beta_N$, from Formula 6 the input current $I_{IN}$ is found with the following approximation method.

Formula 7

$$I_{IN} = 2/\beta_N(2+\beta_P) \quad (7)$$

From Formulas 6 and 7, when the current amplification ratio $\beta_P$ of pnp transistors Q13 and Q14 which form the current compensation circuit is small, the base current of transistor Q11 cannot be compensated sufficiently by means of compensation current $I_3$, such that the input current $I_{IN}$ cannot be reduced sufficiently and the input impedance of the buffer circuit is reduced.

The present invention was devised due to said circumstances, and its purpose is to offer a buffer circuit that is able to achieve a lowering of the input leakage current and to achieve a high input impedance by compensating the base current of the transistor by means of a current compensation circuit; and that is able to avoid a lowering of the input dynamic range by means of the current compensation circuit.

SUMMARY OF INVENTION

In order to achieve the aforementioned purposes, the buffer circuit of the present invention has: a signal output transistor whose base is connected to a signal input terminal, whose collector is connected to a first power source voltage, and whose emitter is connected to a signal output terminal; first and second transistors whose respective emitters are connected to each other, constituting a differential circuit; a voltage-setting transistor whose collector is connected to a first voltage source and whose emitter is connected to the base of the aforementioned first transistor;

a reference voltage source that supplies a reference voltage to the base of the aforementioned second transistor;

a compensation current generation transistor whose emitter is connected to the first power source voltage, and whose collector is connected to the base of the aforementioned voltage-setting transistor;

and a compensation current supply transistor whose emitter is connected to the first power source voltage, and whose collector is connected to the base of the aforementioned signal output transistor;

and the base of the aforementioned compensation current supply transistor and the base of the compensation current generation transistor are connected to the collector of the aforementioned second transistor.

In addition, with the present invention, ideally a first current source is connected between the emitter of the aforementioned signal output transistor and a second power source voltage, a second current source, is connected between the emitter of the aforementioned voltage-setting transistor and second power source voltage, a third current source is connected between the emitters of the aforementioned first and second transistors and the second power source voltage, a capacitor is connected between the collector of the aforementioned compensation current generation transistor and the second power source voltage, and a current source consisting of a current mirror circuit is connected between the first power source voltage and the collectors of the aforementioned first and second transistors.

Furthermore, with the present invention, ideally, the aforementioned first and second current sources supply an identical current; the current amplification ratios of the aforementioned compensation current generation transistor and the aforementioned compensation current supply transistor are identical; and the current amplification ratios of the aforementioned signal output transistor and the aforementioned voltage-setting transistor are identical.

By means of the present invention, the base voltage of the voltage-setting transistor is set by means of the differential circuit and the compensation current generation transistor. Consequently, the emitter voltage, in other words, the set voltage, of the voltage-setting transistor is always maintained virtually equal to that of the reference voltage. The collector current of the compensation current generation transistor is identical to the base current of the voltage-setting transistor, and that current value is set by means of the current amplification ratio of the voltage-setting transistor as well as the second current source that is connected to its emitter.

When the current amplification ratios of the compensation current generation transistor and the compensation current supply transistor are set to the same value, their collector currents are virtually identical. Furthermore, when the current supplied by the first current source and the second source are set to the same value, the base current of the signal output transistor is sufficiently compensated by the collector current of the compensation current generation transistor, and the input current of the buffer circuit is reduced.

REFERENCE NUMERALS AND SYMBOLS AS SHOWN IN THE DRAWINGS

Q1, Q2, Q3, Q4 npn transistor
P1, P2, P3, P4 pnp transistor
IS1, IS2, IS3 Current source
VS1 Voltage source
C1 Capacitor
$V_{CC}$ Power source voltage
GND Ground potential

DESCRIPTION OF EMBODIMENTS

Figure 1:
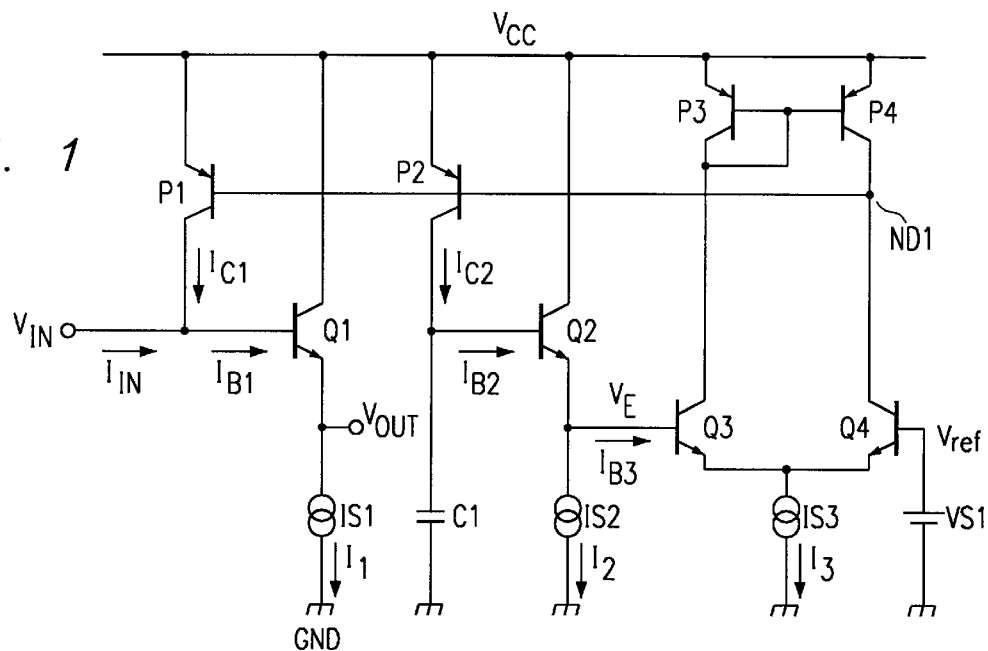
FIG. 1 is a circuit diagram showing one embodiment of the buffer circuit according to the present invention.

FIG. 1 is a circuit diagram of one embodiment of the buffer circuit according to the present invention.

As shown in the figure, for the buffer circuit of the present embodiment, in addition to an npn transistor Q1 that constitutes an emitter follower, a current compensation circuit comprised of npn transistors Q2, Q3, Q4, and pnp transistors P1, P2, P3, P4 is provided.

The base of transistor Q1 (the signal output transistor) is connected to the input terminal of the buffer circuit, its collector is connected to power source voltage $V_{CC}$, and its emitter is connected to current source IS1 as well as to the output terminal of the buffer circuit.

The base of transistor Q2 (the voltage-setting transistor) is connected to the collector of transistor P2 (the compensation current generation transistor); its emitter is connected to power source voltage $V_{CC}$, and its emitter is connected to current source IS2.

Transistors Q3 and Q4 form a differential circuit. The base of transistor Q3 is connected to the emitter of transistor Q2 and a reference voltage $V_{ref}$ is applied to the base of transistor Q4. The emitters of transistors Q3 and Q4 are connected to each other, and that connection is connected to current source IS3. Transistors P3 and P4 form a current mirror, with the bases of these transistors are connected to each other; that connection is connected to the collector of transistor P3 as well as to the collector of transistor Q3. The collector of transistor P4 and the collector of transistor Q4 are connected to each other, and that connection is connected to node ND1. The emitters of transistors P3 and P4 are connected to power source voltage $V_{CC}$.

The base of transistor P1 (the compensation current supply transistor) is connected to node ND1, its emitter is connected to power source $V_{CC}$, and its collector is connected to the base of transistor Q1. The base of transistor P2 is connected to node ND1, its emitter is connected to power source voltage $V_{CC}$, and its collector is connected to the base of transistor Q2. In addition, a capacitor C1 is connected between the base of transistor Q2 and ground potential GND.

The reference voltage $V_{ref}$ applied to the base of transistor Q4, which forms the differential circuit, can be set to virtually the same value as the bias voltage of the transistor Q1 emitter.

The operation of a buffer circuit having the aforementioned composition is explained below.

The emitter voltage $V_E$ of transistor Q2 is maintained at virtually the same level as the reference voltage $V_{ref}$ by means of the emitter follower formed by transistor Q2, the differential circuit formed by transistors Q3 and Q4, and transistor P2. For example, when the emitter voltage $V_E$ of transistor Q2 rises and exceeds the reference voltage Vref, the voltage of output node ND1 of the differential circuit becomes high. In response, the collector current $I_{C2}$ of transistor P2 becomes small, such that the base voltage of transistor Q2 decreases and its emitter voltage $V_E$ also decreases. Conversely, when the emitter voltage $V_E$ of transistor Q2 falls below the reference voltage $V_{ref}$, the voltage of output node ND1 of the differential circuit also falls low. In response, the collector current $I_{C2}$ of transistor P2 increases, such that the base voltage of transistor Q2 rises and its emitter voltage $V_E$ rises as well.

As in the above, when the emitter voltage $V_E$ of transistor Q2 fluctuates for any reason with respect to the circuit, the emitter voltage $V_E$ of transistor Q2 is governed such that it always approaches the reference voltage $V_{ref}$. Therefore, the emitter voltage $V_E$ of transistor Q2 is maintained at virtually the same level as the reference voltage $V_{ref}$.

In addition, the capacitor C1 connected to the base of transistor Q2 is provided to control the oscillation of the circuit. A negative feedback circuit that controls the base voltage of transistor Q2 in response to the voltage of node ND1 is formed by means of transistor P2. Capacitor C1 is connected between the base of transistor Q2 and ground potential GND in order to control oscillation with respect to said feedback circuit.

Here, the current amplification ratios of both transistors Q1 and Q2 are made $\beta_N$, and the current values $I_1$, $I_2$ of current sources IS1 and IS2 are made equal. When the base current of transistor Q3, which forms part of the differential circuit, is made equal to $I_{B3}$, the base current $I_{B2}$ of transistor Q2 is calculated by the following formula:
Formula 8

$$I_{B2}=(I_2+I_{B3})/(1+\beta_N) \tag{8}$$

The collector current $I_{C2}$ of transistor P2 is equal to the base current $I_{B2}$ of transistor Q2. In addition, when the current amplification ratios of transistors P1 and P2 are equal, the collector current $I_{C1}$ of transistor P1 and the collector current $I_{C2}$ of transistor P2 become virtually the same. In other words, the following formula applies.
Formula 9

$$I_{C1}=(I_2+I_{B3})/(1+\beta_N) \tag{9}$$

The base current $I_{B1}$ of transistor Q1 is determined by the current value $I_1$ of current source IS1 and the amplification ratio $\beta_N$ of transistor Q1, resulting in $I_{B1}=I_1/(1+\beta_N)$.

Therefore, the input current $I_{IN}$ of the buffer circuit is calculated by the following formula:
Formula 10

$$I_{IN}=I_{B1}-I_{C1}=I_1/(1+\beta_N)-(I_2+I_{B3})/(1+\beta_N)=-I_{B3}/(1+\beta_N) \tag{10}$$

In other words, when current value $I_1$ of current source IS1 and current value $I_2$ of current source IS2 are set at the same value, the input current $I_{IN}$ is determined by the base current of transistor Q3 and the current amplification ratio of transistor Q1. Usually the current amplification ratio of transistor $Q_3$ is large and its base current $I_{B3}$ is extremely small, such that the value of the input current $I_{IN}$ is extremely small. Consequently, the input impedance of the buffer circuit of the present embodiment is extremely small [sic].

Figure 3:
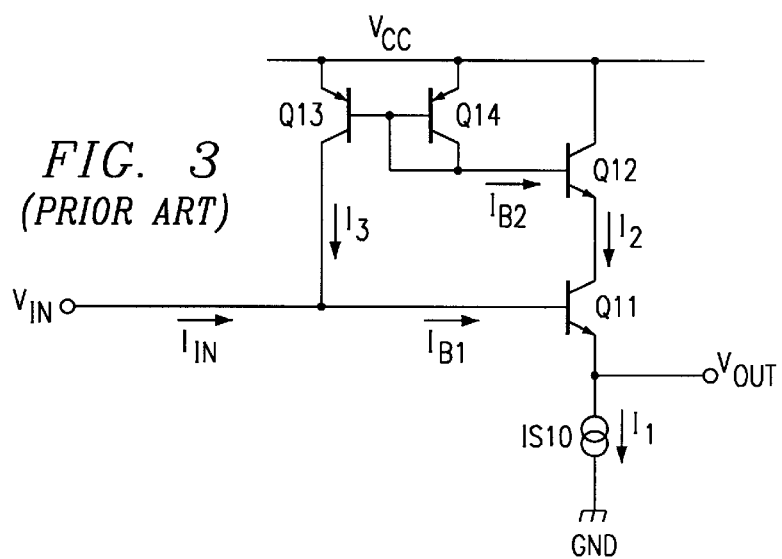
FIG. 3 is a circuit diagram showing one example of a conventional buffer circuit.

Furthermore, as shown in FIG. 1, the limits of the input dynamic range of the buffer circuit of the present embodiment is determined by power source voltage $V_{CC}$ and by the voltage $V_{CE}$ between the emitter-collector of transistor P1, becoming ($V_{CC}-V_{CE}$). Since transistor P1 usually operates in a nearly saturated state, the voltage $V_{CE}$ between the emitter-collector is lower than the voltage between the emitter-base. Therefore, a wider input dynamic range can be obtained for the buffer circuit of the present embodiment than for the conventional buffer circuit shown in FIG. 3.

As explained in the above, by means of the present embodiment, the base voltage of transistor Q2 is established by means of transistor P2 in response to the signal from output node ND1 of the differential circuit, and the emitter voltage of transistor Q2 is established at virtually the same level as the reference voltage $V_{ref}$. The collector current $I_{C2}$ of transistor P2 is the same as the base current $I_{B2}$ of transistor Q2, and is set with the current amplification ratio of transistor Q2 as well as the current $I_2$ of current source IS2. When the current amplification ratios of transistors P1 and P2 are made equal, and when these collector currents $I_{C1}$ and $I_{C2}$ also are set to the same value and the current amplification ratios of transistors Q1 and Q2 are made equal, the base current $I_{B1}$ of transistor Q1 can be sufficiently compensated by means of the collector current $I_{C1}$ of transistor P1, the input current $I_{IN}$ of the buffer circuit can be reduced, and a high input impedance will be maintained.

Figure 2:
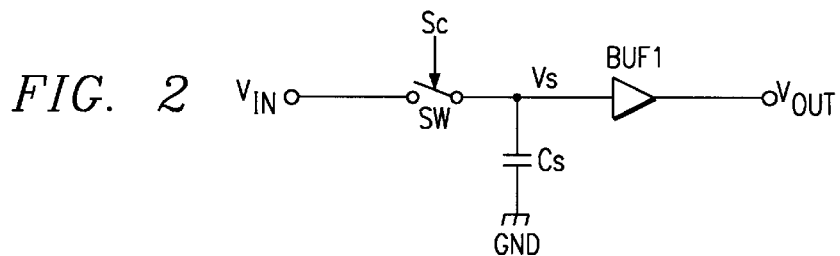
FIG. 2 is a circuit diagram showing one practice example of the buffer circuit according to the present invention.

FIG. 2 is a circuit diagram showing one practice example of the buffer circuit of the present embodiment. As shown in the figure, a sample/hold circuit is formed by means of the buffer circuit BUF1 of the present embodiment, switching element SW, and Capacitor $C_S$.

By controlling the sample signal $S_C$, switching element SW is turned on/off with prescribed timing, and, for example, an analog signal is sampled [for] input signal $V_{IN}$. When switching element SW is turned on, electricity is supplied to sampling capacitor $C_S$ by means of the sampled input signal; while switching element SW is off, the load on capacitor $C_S$ is maintained, such that the sample voltage $V_S$ is maintained.

The sample voltage $V_S$ held by capacitor $C_S$ is input to buffer circuit BUF1, and a signal $V_{OUT}$ is output by said buffer circuit BUF1. Due to the use of the buffer circuit of the present invention in the sample/hold circuit, the leakage current at the input terminal of buffer circuit BUF1 is small, and the input impedance is high. Therefore, for the hold voltage $V_S$, there is little distortion generated due to the leakage current, and a sample/hold circuit with high precision results.

As explained above, by means of the buffer circuit of the present invention, the base current of a transistor can be sufficiently compensated by means of a compensation current, such that it is possible for a buffer circuit to achieve a reduction of the input current and a high input impedance.

In addition, by forming a current compensation circuit by means of a differential circuit and the like, there is an advantage in that the compensation current can be generated without a loss of input dynamic range for the buffer circuit.

What is claimed is:

1. Buffer circuit comprising: a signal output transistor having a base connected to a signal input terminal, a collector connected to a first power source voltage, and an emitter connected to a signal output terminal;

first and second transistors having respective emitters connected to each other, constituting a differential circuit;

a voltage-setting transistor having a collector connected to a first voltage source and an emitter connected to the base of the first transistor;

a reference voltage source that supplies a reference voltage to the base of the second transistor;

a compensation current generation transistor having an emitter connected to the first power source voltage, and a collector connected to the base of the voltage-setting transistor;

a compensation current supply transistor having an emitter connected to the first power source voltage, and a collector connected to the base of the signal output transistor;

and the base of the compensation current supply transistor and the base of the compensation current generation transistor being connected to the collector of the second transistor.

2. The buffer circuit of claim 1, wherein a first current source is connected between the emitter of the signal output transistor and a second power source voltage, a second current source is connected between the emitter of the voltage-setting transistor and the second power source voltage, a third current source is connected between the emitters of the first and second transistors and the second power source voltage, a capacitor is connected between the collector of the compensation current generation transistor and the second power source voltage, and a fourth current source consisting of a current mirror circuit is connected between the first power source voltage and the collectors of the first and second transistors.

3. The buffer circuit of claim 2, wherein the first and second current sources supply an identical current.

4. The buffer circuit of claim 1 wherein the signal output transistor, the voltage-setting transistor, the first transistor and the second transistor are npn transistors, and the compensation current generation transistor and the compensation current supply transistor are pnp transistors.

5. The buffer circuit of claim 1 wherein the current amplification ratios of the compensation current generation transistor and the compensation current supply transistor are substantially identical, and the current amplification ratios of the signal output transistor and the voltage-setting transistor are substantially identical.

6. The buffer circuit of claim 2 wherein the signal output transistor, the voltage-setting transistor, the first transistor and the second transistor are npn transistors, and the compensation current generation transistor and the compensation current supply transistor are pnp transistors.

7. The buffer circuit of claim 3 wherein the signal output transistor, the voltage-setting transistor, the first transistor and the second transistor are npn transistors, and the compensation current generation transistor and the compensation current supply transistor are pnp transistors.

8. The buffer circuit of claim 2 wherein the current amplification ratios of the compensation current generation transistor and the compensation current supply transistor are substantially identical, and the current amplification ratios of the signal output transistor and the voltage-setting transistor are substantially identical.

9. The buffer circuit of claim 3 wherein the current amplification ratios of the compensation current generation transistor and the compensation current supply transistor are substantially identical, and the current amplification ratios of the signal output transistor and the voltage-setting transistor are substantially identical.

10. The buffer circuit of claim 4 wherein the current amplification ratios of the compensation current generation transistor and the compensation current supply transistor are substantially identical, and the current amplification ratios of the signal output transistor and the voltage-setting transistor are substantially identical.

11. The buffer circuit of claim 6 wherein the current amplification ratios of the compensation current generation transistor and the compensation current supply transistor are substantially identical, and the current amplification ratios of the signal output transistor and the voltage-setting transistor are substantially identical.

12. The buffer circuit of claim 7 wherein the current amplification ratios of the compensation current generation transistor and the compensation current supply transistor are substantially identical, and the current amplification ratios of the signal output transistor and the voltage-setting transistor are substantially identical.

* * * * *